United States Patent [19]

Hynecek

[11] 4,229,752

[45] Oct. 21, 1980

[54] VIRTUAL PHASE CHARGE TRANSFER DEVICE

[75] Inventor: Jaroslav Hynecek, Richardson, Tex.

[73] Assignee: Texas Instruments Incorporated, Dallas, Tex.

[21] Appl. No.: 906,385

[22] Filed: May 16, 1978

[51] Int. Cl.² .................... H01L 29/78; G11C 19/28
[52] U.S. Cl. ...................................... 357/24; 357/91; 307/221 D
[58] Field of Search ............... 357/24, 91; 307/221 D

[56] References Cited

U.S. PATENT DOCUMENTS

| | | | |
|---|---|---|---|
| 3,796,932 | 3/1974 | Amelio et al. | 357/24 |
| 3,918,997 | 11/1975 | Mohsen et al. | 357/24 |
| 4,012,759 | 3/1977 | Esser | 357/24 |
| 4,028,716 | 6/1977 | van Santen et al. | 357/24 |
| 4,035,906 | 7/1977 | Tasch et al. | 357/24 |
| 4,047,215 | 9/1977 | Frye et al. | 357/24 |
| 4,065,847 | 1/1978 | Borel et al. | 357/24 |

*Primary Examiner*—Gene M. Munson
*Attorney, Agent, or Firm*—Gary C. Honeycutt; Richard L. Donaldson; Melvin Sharp

[57] ABSTRACT

A uniphase, buried-channel, semiconductor charge transfer device wherein a portion of each cell includes an inversion layer, or "virtual electrode" at the semiconductor surface, shielding that region from any gate-induced change in potential. Each cell is comprised of four regions (I, II, III, IV) wherein the characteristic impurity profile of each region determines the maximum potential generated therein for the gate "on" and gate "off" conditions. Clocking the gate causes the potential maxima in regions I and II to cycle above and below the fixed potential maxima in regions III and IV beneath the virtual electrode. Directionality of charge transfer is thereby achieved, since the potential maximum for region II ($\phi_{max}II$) remains greater than for region I ($\phi_{max}I$) and $\phi_{max}IV > \phi_{max}III$, for both gate conditions. A self-aligned process for fabrication is provided, including a number of ion implant stages to fix the required impurity profiles in each cell for generating the correct potential profiles for charge propagation. CCD imagers, memory devices, an analog processors are contemplated systems wherein the invention is to be implemented.

5 Claims, 19 Drawing Figures

MORE NEGATIVE GATE POTENTIAL

LESS NEGATIVE GATE POTENTIAL (OR POSITIVE)

VIRTUAL PHASE CHARGE TRANSFER DEVICE

This invention relates to semiconductor charge transfer devices and more particularly to a buried-channel, uniphase, charge coupled device (CCD) wherein a portion of each cell includes an inversion layer at the semiconductor surface that functions as a virtual electrode, shielding that region from any gate-induced change in potential.

Uniphase CCD's have been well known for several years. See for example U.S. Pat. No. 4,047,215 issued to Robert Charles Frye et al, showing a uniphase charge coupled device including a continuous conductive gate layer over the signal channel of the CCD. The Frye et al device is a surface channel device, i.e., the signal charge packets are propagated along the surface of the semiconductor. The principal disadvantage of known uniphase CCD devices is their small charge handling capacity and the relatively large clock pulse amplitude requirement, compared to the more common multiphase CCD's.

A more recent addition to the family of charge transfer devices is the buried-channel CCD wherein the mobile charge is stored and transported in an induced channel within the bulk of a thin semiconductor layer. As opposed to the more common surface-type CCD, a buried-channel CCD avoids the trapping effects normally associated with the oxide-silicon interface, thereby improving the charge transfer efficiency. Also, the absence of any interface carrier scattering increases charge transfer mobility. Higher operating frequencies are therefore realized. For a more complete description, see Hamdi El-Sissi et al, "One Dimensional Study of Buried Channel Charge Coupled Devices", *I.E.E.E. Transactions on Electron Devices*, Vol. ED. 21, No. 7, pages 437-447 (July 1974). A buried-channel, uniphase CCD is shown in U.S. Pat. No. 4,065,847.

It is an object of the present invention to provide a single phase buried-channel CCD which is comparable in performance to multiphase CCD's, while retaining all the advantages of singlelevel structure.

One aspect of the present invention is embodied in a uniphase CCD structure having either a continuous or patterned single conductive layer over a multiple-cell signal channel, each cell of which includes four regions (I, II, III, IV) of different impurity profiles implanted or diffused at the proper depth within the semiconductor surface. The characteristic impurity profiles within each region determine the maximum potential generated therein for the gate "on" and gate "off" conditions.

Regions III and IV of each cell include an inversion layer at the semiconductor surface to shield that portion of the cell from any gate-induced change in potential. Clocking the gate causes the potential maxima in regions I and II to cycle above and below the fixed potential maxima in regions III and IV. Directionality of charge transfer is thereby achieved, since the potential maximum for region II remains greater than for region I, and region IV greater than region III, for both gate conditions.

The device further includes a uniform, adherent insulation layer between the semiconductor surface and the uniphase electrode. Signal input means and signal output means are provided, in addition to means for supplying a uniphase clock pulse to the electrode.

Another aspect of the invention is embodied in a process for fabrication of a device including four sequential stages of ion implantation. More specifically, the process begins with a step of selectively implanting a first does of donor impurity ions in an oxide layer covering an N-type channel in a silicon body of P-type conductivity, to establish a forst source of impurity for subsequent use in fixing the profile for region II of each cell. A doped polysilicon gate electrode is then deposited and patterned on the oxide layer covering the channel regions at locations to become regions I and II of each cell. The polysilicon is then used as a mask for removing the oxide over channel regions to become regions III and IV of each cell. Photoresist is then patterned to cover region III, while additional donor impurities are implanted in region IV of each cell location. The photoresist is stripped, and more donor ions added for cell regions III and IV. A heat treatment follows, to anneal implant damage and diffuse impurities, both from the oxide into region II, and to increase the depth of impurities in regions III and IV. Finally, acceptor impurities are placed in regions III and IV at a more shallow depth than the new depth of donors therein, to complete the necessary profiles within each cell.

An alternative process sequence is provided, including two donor ion implantations or diffusions, followed by two acceptor ion implantations or diffusions. The profile of region II of each cell is determined by the buried channel doping itself, since no modification thereof is required for purposes of the invention. A continuous gate electrode is provided, as distinguished from the patterned gate of the previously stated embodiment.

Figure 1:
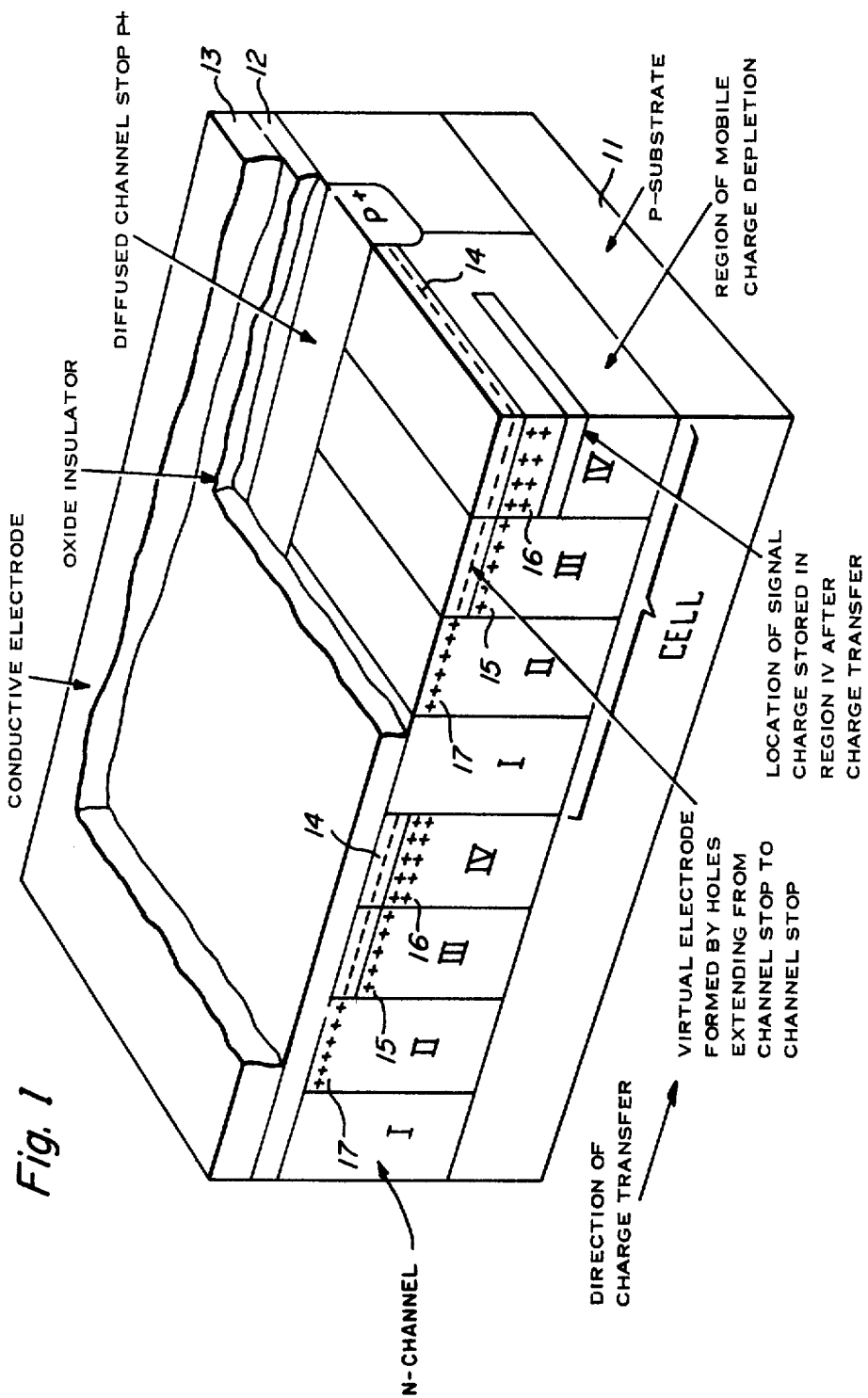
FIG. 1 is a greatly enlarged perspective view with cutaway portions in cross section, taken both longitudinally of and normal to the channel region of a CCD structure according to the invention.
Figure 2C:
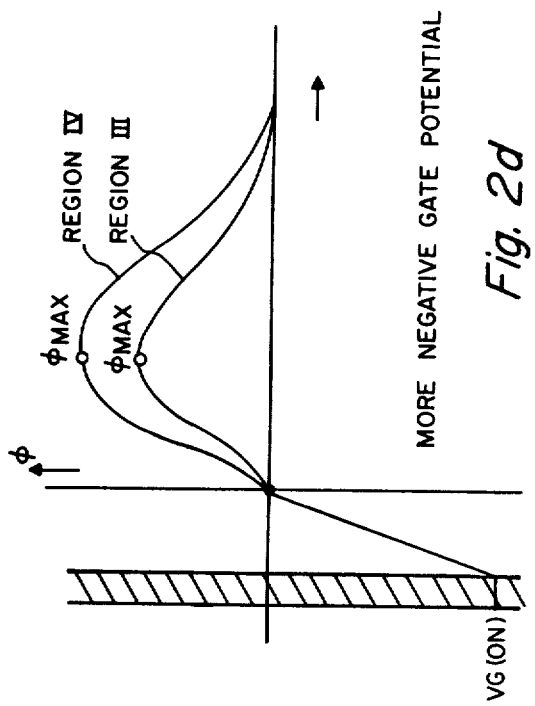
FIGS. 2a-2d are graphs showing the potential profiles for each of the four regions within each cell, for the gate "off" condition, and for the gate "on" condition.
Figure 2D:
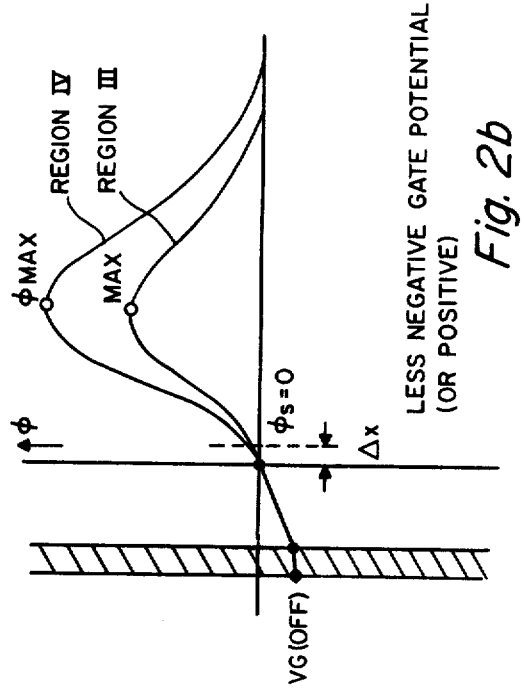
Figure 2A:
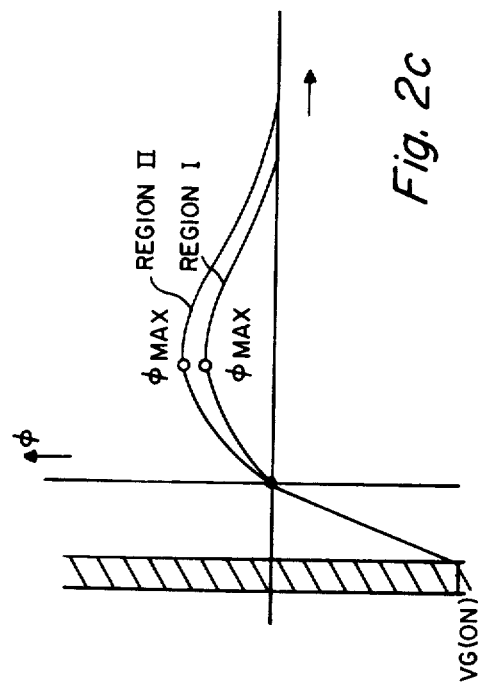
Figure 2B:
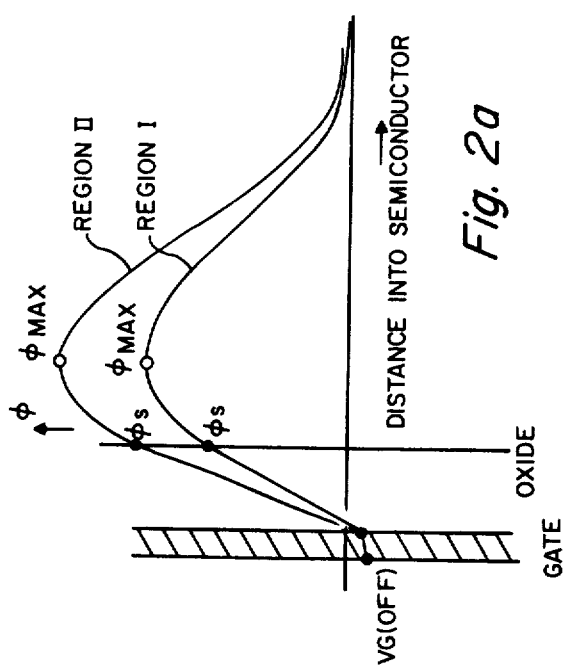

FIG. 1 is a diagramatic view showing one cross-section along the channel of a uniphase CCD structure embodying the invention, and a second cross section normal to the first. The device channel is formed in P-type silicon substrate 11 having a doping density substantially greater than $1 \times 10^{15} \text{cm}^{-3}$ and preferably greater than $1 \times 10^{15} \text{cm}^{-3}$ but not greater than $10^{18} \text{cm}^{-3}$. The upper surface of substrate 11 as seen in FIG. 1 is covered by insulating layer 12, typically of silicon dioxide, having uniform thickness extending along the length of an N-type channel region. A continuous gate electrode 13 extends along the length of the channel and is connected to a clock pulse source. Spaced along the length of the channel are a plurality of cells, each of which includes a P-type inversion layer 14 at the surface of regions III and IV of each cell, which acts as a virtual electrode, shielding that portion of each cell from any gate-induced change in potential. Just below the inversion layer the buried channel potential maxima of regions III and IV are determined by selective donor implants 15 and 16. Each cell also includes regions I and II wherein the potential maxima are determined by the gate potentials, and the impurity profiles, including donor implant 17. Thus, each cell is characterized by four characteristic potential maxima, two of which are influenced by the gate potential, and two of which are not.

The structure of FIG. 1 also includes an input structure (not shown) including first N+ region within the channel region, with an ohmic contact for receiving a signal voltage. Spaced from the first N+ region is a second, floating N+ region which underlies a portion of the gate conductor of the first cell of the structure. A conductive electrode on the insulator overlaps the portions of both N+ regions, for receiving sampling pulses. During each "on" period of the clock pulse train, a sampling pulse is applied to the electrode charging the floating N+ region to a level determined by the amplitude of the signal voltage applied to the input N+ region. During "off" periods of the clock pulse train, charge transfers as a minority carrier packet from the floating N+ region into the buried channel under the conducting electrode of the first cell to the region II. The charge packet and subsequent charge packets are then propagated toward the output end of the channel by application of the clock pulse train to the gate electrode.

The output structure (not shown) includes a pair of spaced apart N+ regions, the first of which is overlapped by the conducting electrode of the final cell of the CCD channel. An electrode on the insulating layer extends between and overlaps the N+ regions. An ohmic connection to the second N+ region permits application of a reference voltage thereto while an ohmic connection to the first N+ region is connected to the gate of an insulated gate field effect transistor connected in a source follower configuration with a load resistor to provide output signals from the CCD. The above described input and output structures are included by way of example only. They are illustrated in U.S. Pat. No. 4,047,215. Other input structures, and other output structures, such as floating gates, are readily substituted, without departing from the scope of the invention.

The cross section of FIG. 1 which extends normal to the channel shows a P+ channel-stop region 18 defining one of the lateral boundaries of the charge transfer region. Another P+ channel stop region (not shown) defines the other lateral boundary of the channel, each cell of which includes a P+ inversion layer 14 shielding the transfer region from additional gate-induced change in potential. Also, blooming control structures may be substituted for one of the channel-stop regions.

FIG. 2 shows the potential profile for each of the four buried channel regions within each cell, for a given gate potential, as a function of the distance from the surface of the semiconductor body. By reference to these profiles, one can understand how a charge packet is transferred from one cell to another. In FIG. 2a the potential profiles for regions I and II are given, for the gate "off" condition (less negative or slightly positive). These profiles are achieved, for example, by a phosphorous implant and diffusion in both regions I and II, plus a shallow arsenic implant in region II only. In FIG. 2b, the potential profiles of regions III and IV are shown, for the gate "off" condition. In FIG. 2c, the potential profiles for regions I and II are shown for the gate "on" condition. In FIG. 2d, the profiles for regions III and IV are shown, for the gate "on" condition. The potential profiles for regions III and IV are achieved for example, by a relatively light phosphorous implant in region III and a heavier phosphorous implant in region IV followed by diffusion and combined with the shallow boron implant equal in both regions III and IV.

Figure 3B:
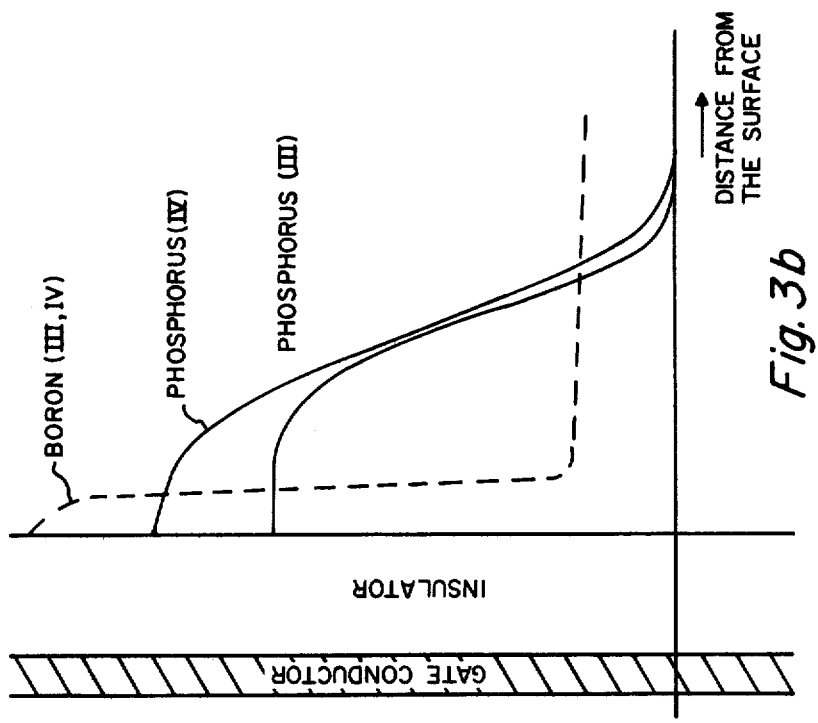
FIGS. 3a-3b illustrate the impurity concentration profiles for each of the four regions within each cell of the device of FIG. 1.
Figure 3A:
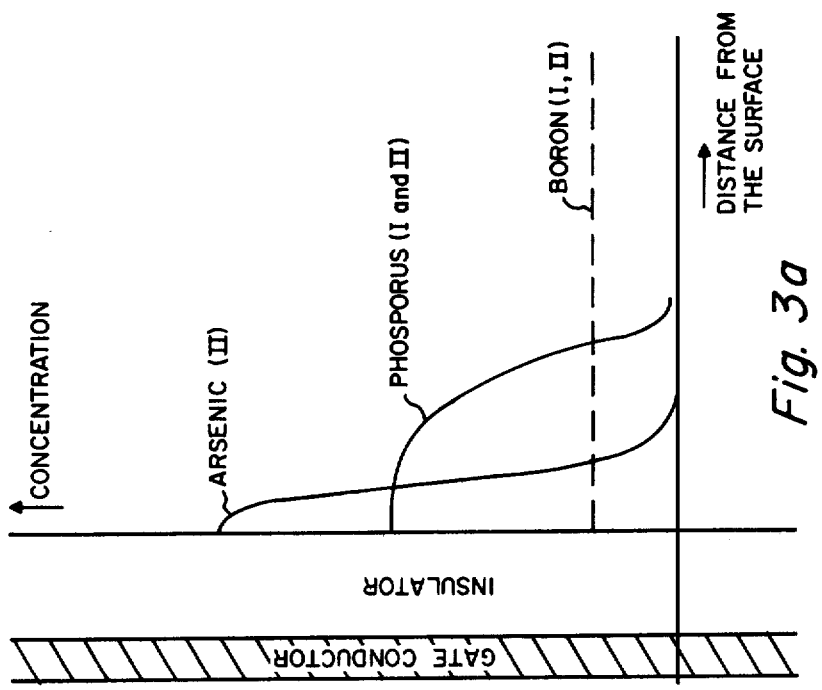

FIG. 3a shows the impurity concentration profile in region I and region II. The phosphorous doping is the same in both regions, while the arsenic doping exists in region II only.

FIG. 3b shows the impurity concentration profiles for region III and region IV. The boron doping is the same for both regions while the heavier phosphorous doping is selectively located in region IV. Phosphorous doping in region I and II is lighter than in region III.

Referring again to FIG. 2, it will be assumed that the following relationship exists for the gate "off" condition:

$$\phi_{max}II > \phi_{max}I > \phi_{max}IV > \phi_{max}III$$

Also, the following relationship exists for the gate "on" condition:

$$\phi_{max}IV > \phi_{max}III > \phi_{max}II > \phi_{max}I$$

The charge transfer is achieved when the gate voltage is lowered from the "off" condition to the "on" condition, and raised back to the "off" condition. To illustrate this, consider a packet of charge stored in region II. This region has the highest $\phi_{max}$ so that the electron charge will be confined to this region. As the gate voltage is lowered to the "on" condition, $\phi_{max}II$ and $\phi_{max}I$ are lowered. However, $\phi_{max}III$ and $\phi_{max}IV$ remain essentially constant since the maximum potentials for these regions are fixed by the inversion layer at the surface. That is, holes from the channel stop regions are attracted instantly to the surface of the channel, thus shielding regions III and IV from gate potential. At this point the signal charge is transferred to region IV since this region has the greatest maximum potential. The small layer of holes which occupy the indicated space form a virtual electrode extending from the channel stop. The formation of this virtual electrode by the carriers of opposite polarity and its function in achieving signal charge transfer is a key feature of this invention.

By raising the gate potential back to the "off" condition, charge will flow to region II of the subsequent cell.

Figure 4:
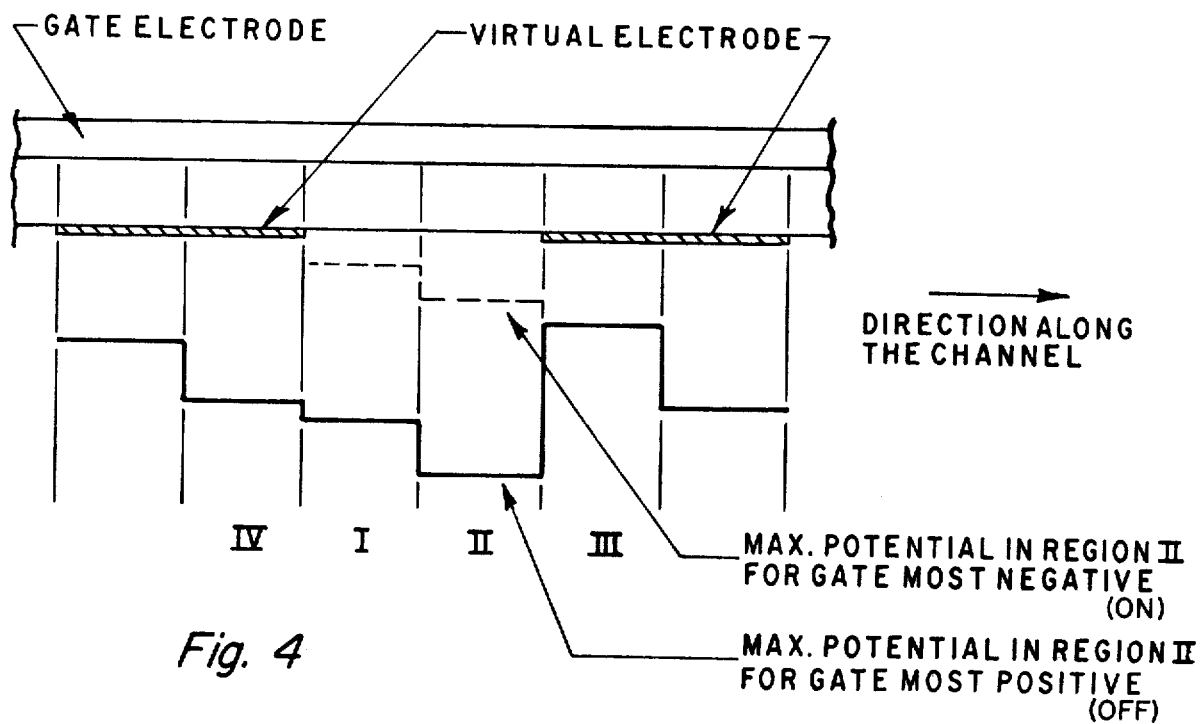
FIG. 4 is a diagram of the potential wells associated with operation of the device of the invention.

In FIG. 4, $\phi_{max}$ for each region is represented by the stair-step pattern of potential wells. The gate "off" condition generates a pattern of potential wells indicated by the heavy solid line, i.e., a four-step potential descending from left to right beginning with region III, and reaching the deepest level at region II. For the gate "on" condition, the four-step descending pattern begins with region I and descends stepwise to region IV. Thus, a pulse train applied to the single electrode achieves the required propagation of charge packets to successive adjacent cells.

Figure 5A:
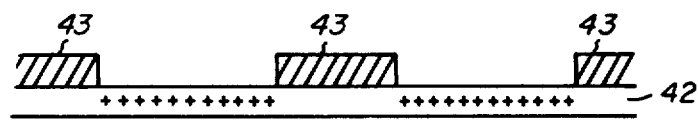
FIGS. 5a-5e illustrate a process sequence for fabrication of an embodiment of the invention.

One process embodiment for fabrication of the device of the invention is illustrated in FIGS. 5a thru 5e. As shown in FIG. 5a, the process begins with a monocrystalline silicon wafer 41 of P-type conductivity having a doping density of $1 \times 10^{15} cm^{-3}$ to $5 \times 10^{16} cm^{-3}$, wherein a buried channel region has been defined by N type doping and by the formation of P+ channel stop regions; and wherein input means and output means have been provided at the opposite ends of the channel. Gate oxide layer 42 is then grown by oxidation to the desired thickness, for example, about 1000 angstroms. Photoresist 43 is then patterned on the oxide layer, followed by a selective implantation of donor impurities such as arsenic, phosphorous or antimony into the oxide layer, for diffusion into the silicon surface in a later step in processing.

Figure 5B:
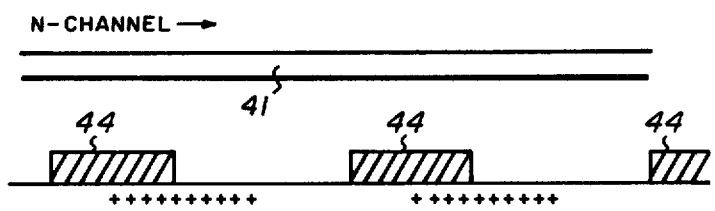
Figure 5C:
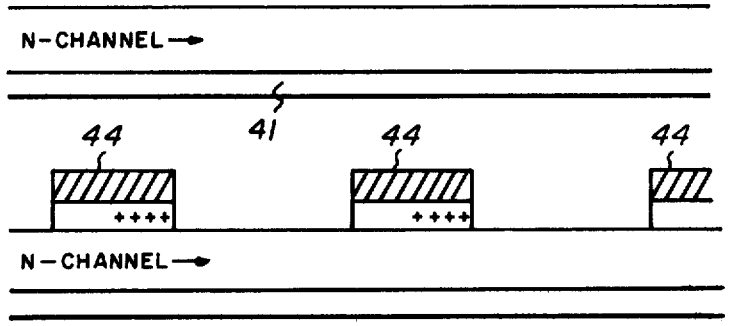
Figure 5D:
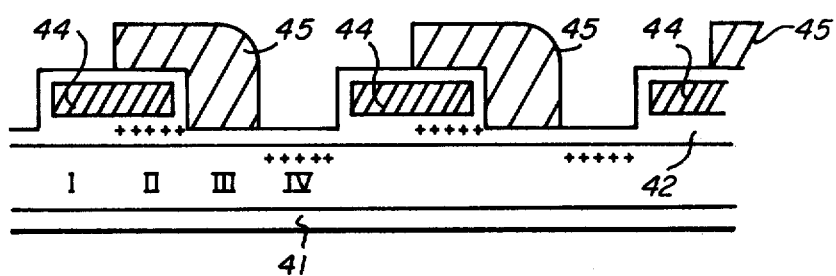
Figure 5E:
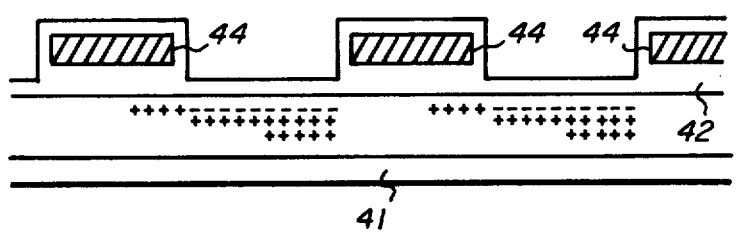

The photoresist mask is then stripped from the surface and a layer of doped polysilicon 44 is deposited over the oxide. The polysilicon is patterned as shown in FIG. 5b to provide apertures which expose both a portion of the implanted region and a portion of the region shielded from implantation by mask 43. Gate oxide in the windows is then removed by known etching techniques. The newly exposed silicon wafer is then subjected to oxidation, concurrently with the formation of an oxide layer over the doped silicon mask 44. A second photoresist mask 45 is then patterned, as shown in FIG. 5d, covering part of each aperture and the adjacent portion of each oxidized polysilicon region. At this point, additional donor impurities are implanted through the oxide directly into the silicon channel. Photoresist mask 45 is then stripped and additional donor impurities are again implanted through the oxide directly into the silicon channel as shown in FIG. 5e. This completes the implantation of all donor impurities required for device fabrication. In a subsequent heat treatment, the implanted impurities are diffused deeper into the silicon as required to form the correct potential profiles; while impurities positioned in the oxide are diffused into the silicon.

Next, through the same aperture, acceptor impurities such as boron, gallium or indium are implanted through the oxide directly into the silicon channel. This implantation is followed by heat treatment to anneal the implant damage and activate the implanted impurities. This completes the fabrication sequence necessary to obtain the required impurity profiles for generating the correct potential profiles.

Contacts are then provided to complete the device with doped polysilicon pattern 44 serving as the gate electrode.

A second process embodiment for fabrication of the device is illustrated in FIG. 6. As shown in FIG. 6, the process begins with a monocrystalline P-type silicon wafer 51 of the same resistivity as before, and which has the N-type buried channel previously defined by P+ channel stop regions; and which also includes the essential input and output structures previously known in the art. Alternatively, of course, these features may be added after completing the process steps of the invention.

Figure 6A:
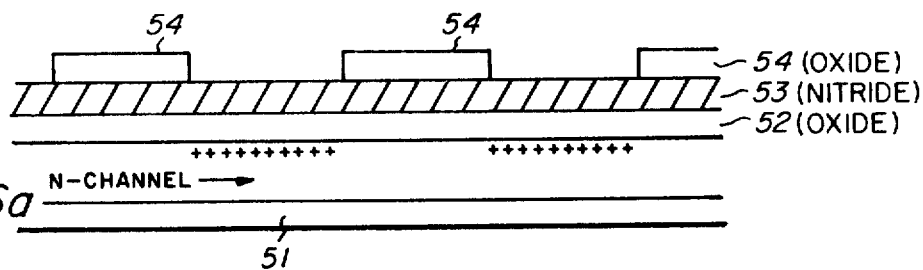
FIGS. 6a-6e illustrate a second process sequence for fabrication of another embodiment.
Figure 6B:
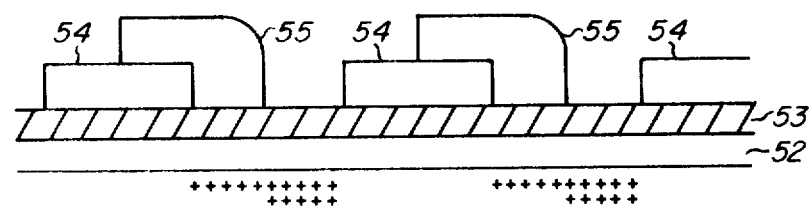
Figure 6C:
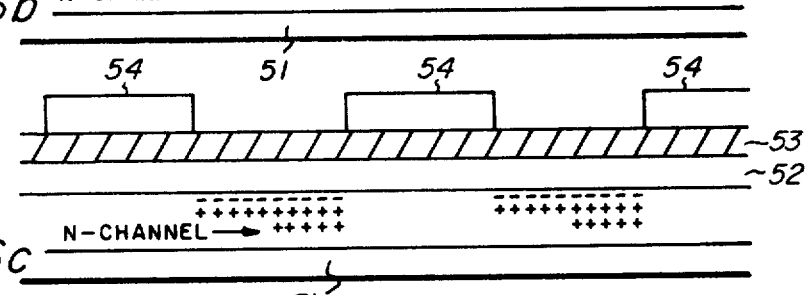
Figure 6D:
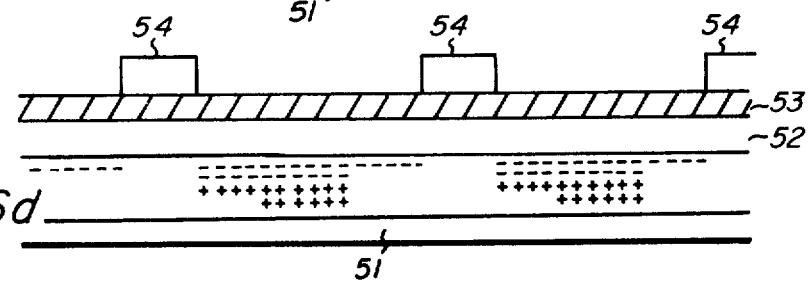

Oxide layer 52 having a thickness of about 800 angstroms, for example, is grown by thermal oxidation. Subsequently, layer 53 of silicon nitride having a thickness of about 400 angstroms for example, is formed on the oxide layer. Subsequently, a second oxide layer 54 is deposited to a thickness of about 3,000 angstroms, for example, and patterned to selectively expose the areas of the channel which are to become regions III and IV. Donor impurities are then implanted through the exposed nitride and the underlying oxide layer with sufficient energy to enter the silicon surface. Next, as shown in FIG. 6b, a photoresist mask 55 is defined on the top of the structure covering a portion of each aperture and the adjacent portion of the previously patterned oxide mask. A second implant of donor impurities is carried out with an energy sufficient to penetrate the insulation layers and enter the silicon surface. The photoresist is stripped and the implants are thermally diffused deeper into the semiconductor. This is followed by an acceptor ion implant, again using the previously patterned oxide mask shown in FIG. 6c. A new photoresist layer is deposited and patterned to form a second photoresist mask having essentially the same pattern as the previous photoresist mask. By a selective etch step, the previously defined oxide mask is then redefined by removing a portion of each segment to thereby additionally expose that portion of nitride layer 53 which covers region I of each cell shown in FIG. 6d. The second photoresist layer is then stripped, followed by a second implant of acceptor impurities at energy levels sufficient to penetrate through the nitride layer and the underlying oxide layer and enter the silicon surface at regions I, III and IV.

Figure 6E:
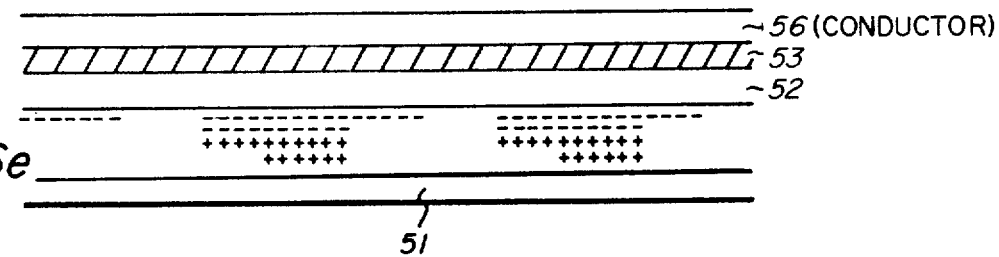

The structure is then thermally annealed to activate the impurities, thereby completing the definition of impurity profiles necessary to generate the correct potential profiles within each cell structure. The patterned oxide layer and nitride layer are then stripped and replaced by a continuous conductive layer 56, such as aluminum or tin oxide, to form the single-phase clock electrode 57 as shown in FIG. 6e.

Impurity profiles in FIG. 3 are applicable to the structure given in FIG. 5e. Impurity profiles resulting from process given in FIG. 6 produce essentially the same potential profiles described in FIG. 2 with appropriate DC gate voltage offset.

Figure 7:
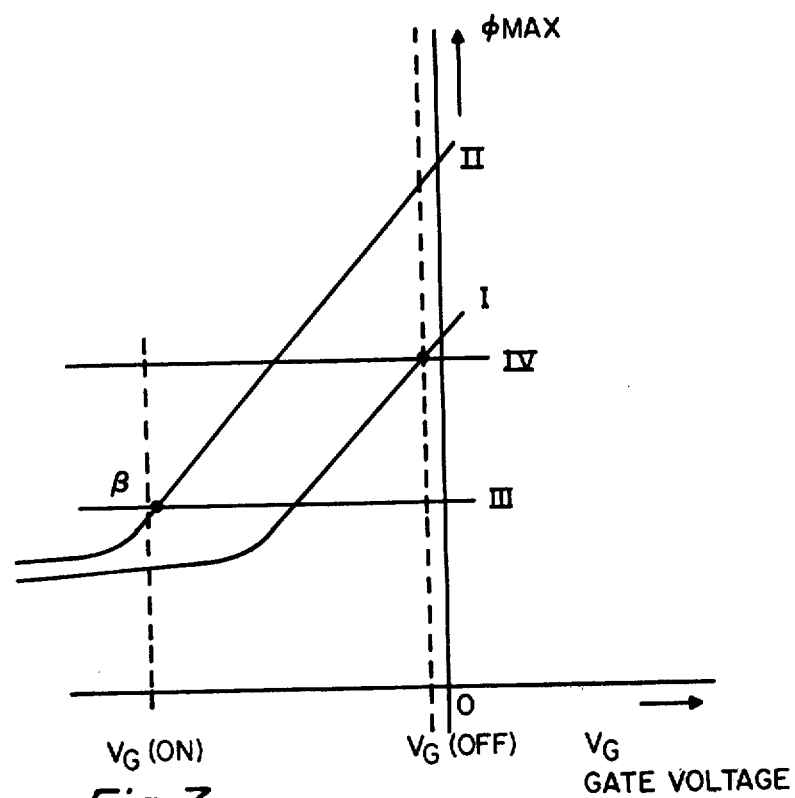
FIG. 7 is a plot of the maximum potential for each region of the cell, as a function of gate voltage.

FIG. 7 is a plot of the maximum potential for each region of the cell, as a function of gate voltage. In order to evaluate the performance of the device, we can follow these curves to see that a smaller votlage swing is sufficient to cause propagation of the signal charge packets to successive cells, as compared to similar curves given for prior devices. The maximum potentials for regions III and IV are independent of clock voltage, while those for regions I and II are cycled. A charge stored in region II at the gate "off" condition remains there, as voltage shifts in the negative direction, until the maximum potential for region II falls below potential in region III, at which time the charge is transferred through region III, and immediately to IV, since IV always has a greater maximum potential than III. By returning the gate to its "off" condition, the charge is transferred to region II of the next cell, and the cycle is then repeated.

The above embodiments for fabrication are not intended to limit the scope of the invention, but only to illustrate preferred embodiments for producing the device of the invention. It is also apparent that polarities can be reversed to produce a P-channel device by starting with an N-type silicon substrate. Also, compound semiconductors may be employed including III-V and II-VI compounds such as indium antimonide or mercury cadmium telluride.

It will be apparent to those skilled in the art that the device of the invention is useful for implementation in CCD imagers, including full frame storage and line addressable types, in analog processors, memories, linear shift registers, and memory systems with serial, serial-parallel-serial or random access organiztion. Blooming control structures are also readily incorporated in each of these embodiments.

An area CCD imager was built in accordance with the process sequence of FIG. 5. The chip area was 117,000 mils$^2$ and the array size was 245×338 pixels (cells). The implant energies and dosages were as follows:

1st As 80 keV $1.3 \times 10^{13}$ cm$^{-2}$
2nd P 180 keV $1.0 \times 10^{12}$ cm$^{-2}$
3rd P 180 keV $2.0 \times 10^{12}$ cm$^{-2}$
4th B 31 keV $1.2 \times 10^{13}$ cm$^{-2}$ The characteristics of the completed imager were as follows:
Dark current—4 na/cm$^2$
Charge transfer efficiency—99.99%
Well capacity—254,000 electrons

I claim:

1. A charge-transfer device comprising a semiconductor substrate of one conductivity type including therein a buried channel of opposite conductivity type for charge-transfer, an insulating layer on said substrate over said channel, a conductive layer covering said insulating layer for receiving charge transfer clock pulses, said conductive layer being separated from said channel by said insulating layer, said substrate further including input means for inputting charge packets to one end of said channel and output means for extracting charge packets from the opposite end of said channel, and wherein along the length of said channel first storage and transfer regions constituting a clocked phase are separated by second storage and transfer regions constituting a virtual phase, a transfer region being located between the input means and a corresponding storage region, said virtual phase including a surface layer of said one conductivity type, having a higher impurity concentration than the substrate; a first layer of immobile charge comprised of dopant impurities of opposite conductivity type from that of said substrate included in said second transfer and storage regions, having a higher concentration in the storage regions than in the transfer regions; a second layer of immobile charge comprised of dopant impurities of said one conductivity type in only the transfer regions of said clocked phase.

2. A device as in claim 1 wherein the substrate is p-type silicon and the buried channel is of n-type conductivity.

3. A device as in claim 1 wherein the substrate is n-type silicon and the buried channel is of p-type conductivity.

4. A device as in claim 1 wherein each adjacent pair of clocked phase and virtual phase regions comprises a cell of four regions having different impurity profiles, wherein said surface layer of the virtual phase regions selectively shields the virtual phase transfer and storage regions from gate-induced changes in potential maxima.

5. A device as in claim 1 wherein the semiconductor is selected from silicon, germanium, gallium arsenide, indium antimonide, mercury cadmium telluride, and other semiconductor materials.

* * * * *